United States Patent
Rubenstein et al.

(10) Patent No.: US 6,456,501 B1
(45) Date of Patent: Sep. 24, 2002

(54) QUICK RELEASE MECHANISM FOR SLIDING RAIL

(75) Inventors: Brandon Rubenstein, Loveland, CO (US); Eugene A. Miksch, Loveland, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/918,765

(22) Filed: Jul. 30, 2001

(51) Int. Cl.[7] .............................. H05K 7/12; H05K 7/14
(52) U.S. Cl. ....................... 361/759; 361/684; 361/753; 361/756; 361/801; 361/802; 211/41.17
(58) Field of Search ................................ 361/683–686, 361/727, 728, 732, 740, 741, 753, 756, 796–802; 211/26, 41.17; 312/223.1, 223.2

(56) References Cited

U.S. PATENT DOCUMENTS

| | | | |
|---|---|---|---|
| 5,262,923 A | * | 11/1993 | Batta et al. ................. 312/333 |
| 5,653,518 A | * | 8/1997 | Hardt ....................... 312/334.4 |
| 5,730,515 A | * | 3/1998 | Ho ........................... 312/334.7 |
| 5,734,557 A | * | 3/1998 | McAnally et al. ........... 361/683 |
| 6,246,576 B1 | * | 6/2001 | Sands et al. ................. 361/683 |
| 6,252,765 B1 | * | 6/2001 | Balzaretti et al. ........... 361/683 |

* cited by examiner

Primary Examiner—Jayprakash N. Gandhi

(57) ABSTRACT

A drive unit quick release apparatus is provided on one guide rail of a pair of guide rails mounted to the drive unit for engaging and releasing a drive unit from a chassis. The apparatus includes a resilient cantilevered arm mounted to the drive unit, an engaging structure positioned on the arm to selectively maintain the drive unit in the chassis, and a lever connected to the resilient arm to facilitate disengaging the engagement structure and removing the drive unit from the chassis. The lever is positioned generally perpendicular to the resilient arm and to the axis of travel of the drive unit out of a bay in the chassis. In this configuration, a force applied to the lever causes the resilient arm to flex inwardly and disengage the engaging structure from a retaining slot in the chassis. Additionally, the continued application of the force to the lever moves the attached drive unit out of the chassis.

16 Claims, 3 Drawing Sheets

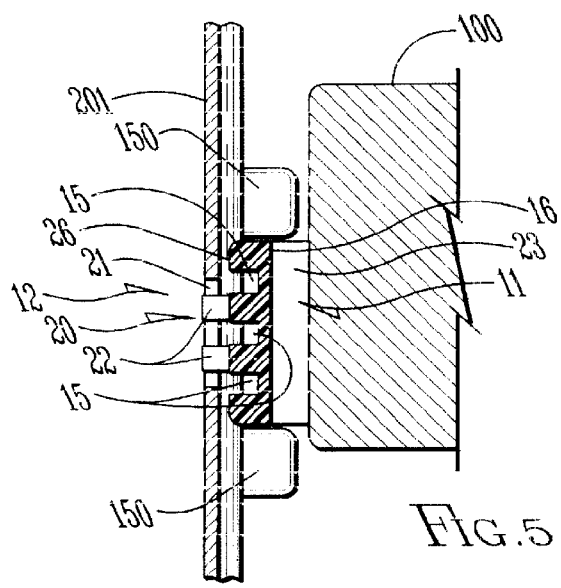
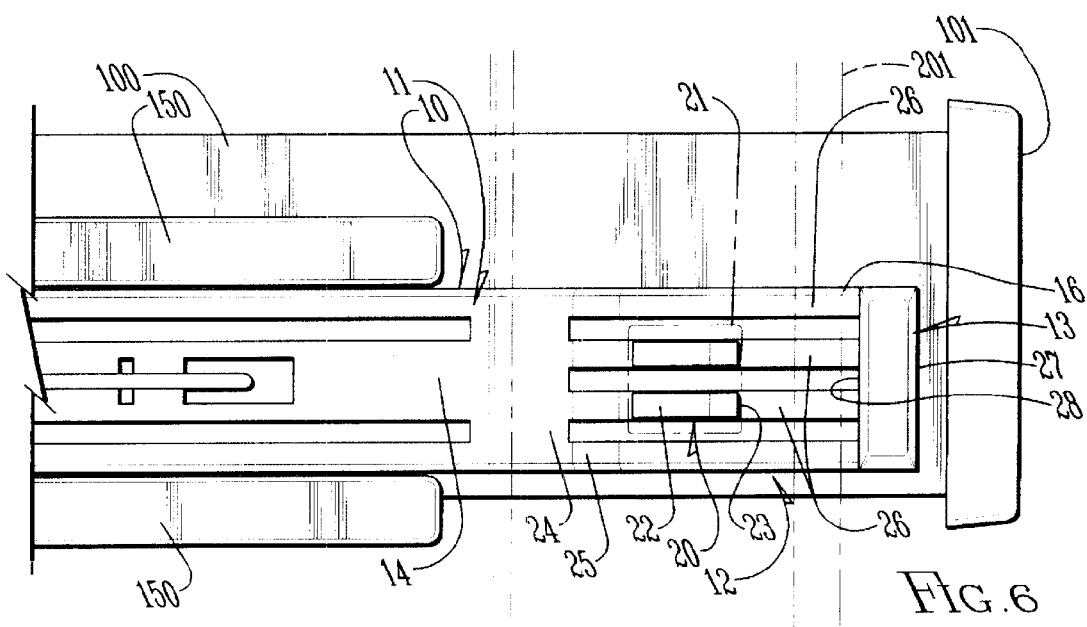

QUICK RELEASE MECHANISM FOR SLIDING RAIL

BACKGROUND OF THE INVENTION

1. Field of the Invention

This invention relates generally to an apparatus facilitating the use of an electronic component in a chassis and, more particularly, to a quick-release mechanism to disengage and remove a computer drive unit from a computer chassis.

2. Description of the Related Art

Drive units, or peripheral devices, such as CD-ROMs, disk drives, modems, and other devices, are electronic, or more specifically computer components that provide a computer with increased functionality. Many of these components can be temporarily interfaced with the CPU and related circuitry of a main computing unit by inserting the device into a slot in a computer chassis. An engaging means is typically provided to secure the position of the device within the chassis. When another computer component is desired, the inserted device is disengaged and removed from the computer chassis and replaced with the new component that performs a different function.

Various designs have been proposed for providing a means for quickly and easily disengaging and removing drive units from a computer. For instance, a device bay retention mechanism is taught by Balzaretti et al., in U.S. Pat. No. 6,252,765. The mechanism requires a control arm to be slidably coupled to a frame, and first and second locking arms to be coupled to the control arm. A control arm latch is connected to the control arm at a first member and is releasably coupled to a release trigger arm at a second free member. Also, an ejection mechanism is attached to the rear end of the frame. To release and remove a drive unit from a computer bay, a release button is depressed to move the control arm to engage the control arm latch with the release trigger arm. The movement of the control arm causes the first and second locking arms to move outwardly from the support frame to disengage the locking arms from the drive unit. The ejection mechanism, using biased springs, then partially ejects the peripheral device such that it can be grasped and fully removed by a user. Although this mechanism is simple to use, it requires many moving parts and provides a costly solution for removing a drive unit. Further, the mechanism necessitates the use of space above and/or below the peripheral device to mount within a computer frame.

Sands et al., in U.S. Pat. No. 6,246,576, provide a latch and release mechanism for disengaging an electronics module in a computer chassis drawer. The mechanism comprises an elongate bendable member having an actuator at a first member, an engagement structure at a second free member, and a locking tab located between the first and second free member. The engagement structure is affixed to a retainer tab in the electronics module. The locking tab is configured to be mateably received in a slot in the electronics module. A number of slots are also provided in the computer chassis to couple the electronics module with the chassis when the locking tab is inserted into the slots. A force applied to the actuator will cause the mechanism to bend to raise the locking tab at least partially out of the locking tab slot and completely out of the slot in the chassis. At this point, the electronics module is not constrained within the chassis and may be slid out. Although this mechanism provides a fairly simple design, it does not provide a mechanism that can be used to simultaneously release the drawer from the locking tab slot and pull the drawer out of the computer chassis. The user must apply a pressing force to bend the mechanism and another pulling force to move the drawer to a different position.

Further, Hardt, in U.S. Pat. No. 5,653,518, teaches the use of a pair of quick release drive unit rail members, each comprising a generally L-shaped rail member and arm attached to a drive unit. The rail member and arm are located on each of the two sides of the drive unit. The arm has a detent movable relative to a slot in the frame of a computer unit and extends beyond the front face of the drive unit. The arm of each rail member moves between an outwardly extended position to maintain the drive unit in the frame and an inwardly disengaged position for removing the drive unit from the frame. To release the drive unit from the frame, the portion of the arms extending beyond the drive unit front face are pressed together to flex the arms and move the detents from the slots in the computer frame. At the same time, another hand is used to pull the drive unit from the frame. As with the Sands patent, this mechanism does not provide a device that can be used to simultaneously release the unit and pull the unit out of the frame. Further, the use of a rail member and slot on each side of drive unit is space-consuming.

Thus, what is needed is an apparatus to facilitate the engaging, disengaging and removal of a drive unit from a computer chassis. The apparatus should function as a typical drive unit sliding rail to cooperatively guide the drive unit into and out of a computer chassis while using a minimal space in the chassis. Further, the apparatus should necessitate only a single pulling force input to both disengage and remove the drive unit.

SUMMARY OF THE INVENTION

It is thus an object of the present invention to provide a quick release apparatus for securely positioning and easily removing a drive unit from a computer chassis. It is a further object of the present invention to provide such an apparatus with a lever to provide sufficient leverage to move an engaging structure from an engaged to a disengaged position. It is a further object of the present invention to arrange the lever and resilient arm in such a configuration as to require only a single, continuous force to be applied to disengage the engaging structure from the chassis and to remove the drive unit from the chassis. It is still a further object of the present invention to provide the apparatus on only one side of a drive unit such that the drive unit can be removed when only one side of the unit is accessible and further uses minimum space for a quick-release apparatus.

The present invention meets these objects by providing an apparatus for releasably engaging a drive unit in a chassis and comprises a guide rail mounted to the drive unit, the guide rail having a first member, a resilient arm extending longitudinally from the first member, an engaging structure positioned to maintain the drive unit in the chassis, and a lever connected to the resilient arm to facilitate disengaging the engagement structure and removing the drive unit from a bay of the chassis. The guide rail is mounted to the drive unit at the first member. The engaging structure is positioned on the arm between the first member and resilient arm and is configured to releasably engage a slot in the computer chassis. To facilitate moving the engaging structure out of the computer chassis slot, the lever is positioned generally perpendicular to the resilient arm. In this configuration, an outward pulling force applied to the lever forces the resilient arm to flex inwardly towards the drive unit and the engaging structure to deflect away from the computer chassis. When a sufficient force is applied, the engaging structure clears the slot and continued application of the force to the lever slidably removes the drive unit from a bay of the computer chassis. The present invention thus provides a simple method for quickly releasing and removing a drive unit or peripheral device from a computer chassis. The release mechanism is incorporated on one side of the unit and thus saves space compared to dual rail release mechanisms. Further, the apparatus only requires a single, continuous force to be applied to disengage the engaging structure and at least partially remove the drive unit from the chassis.

Other advantages and components of the present invention will become apparent from the following description taken in conjunction with the accompanying drawings, which constitute a part of this specification and wherein are set forth exemplary embodiments of the present invention to illustrate various objects and features thereof.

BRIEF DESCRIPTION OF THE DRAWINGS

FIG. 5 is a cross-sectional view of the present invention taken along line 5—5 of FIG. 3 showing the guide rail mating with the chassis and the retention tabs engaging the slot in the chassis.

FIG. 6 is a cross-sectional view of the present invention taken along line 6—6 of FIG. 3 showing the guide rail, resilient arm and retention tabs mounted on a drive unit partially inserted into the chassis.

DETAILED DESCRIPTION OF THE INVENTION

Figure 1:
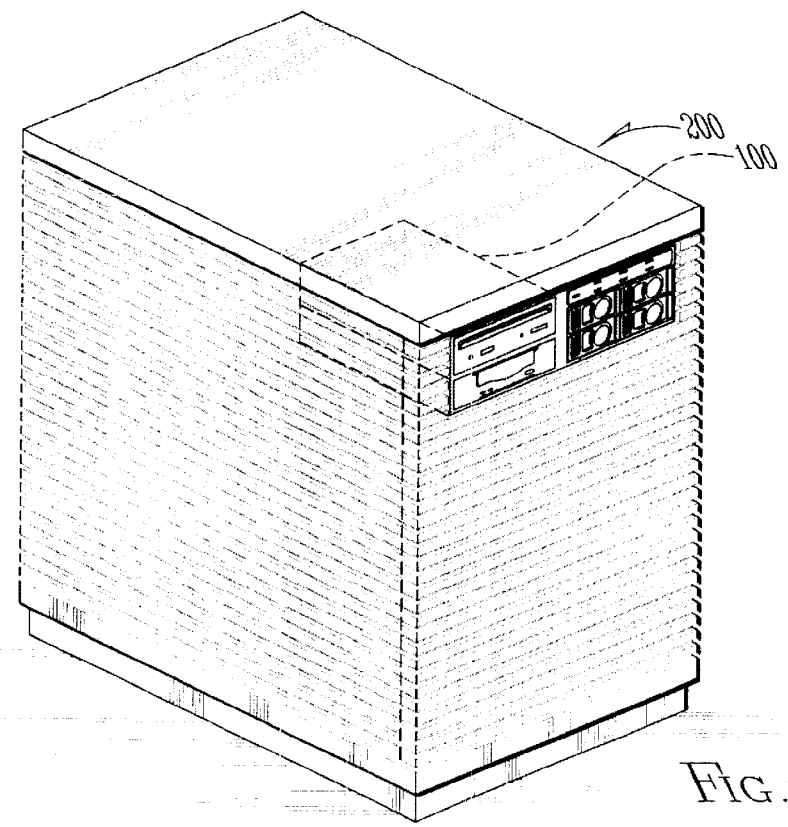
FIG. 1 is a perspective view of a computer system frame showing the drive unit lever engaging apparatus of the present invention.
Figure 2:
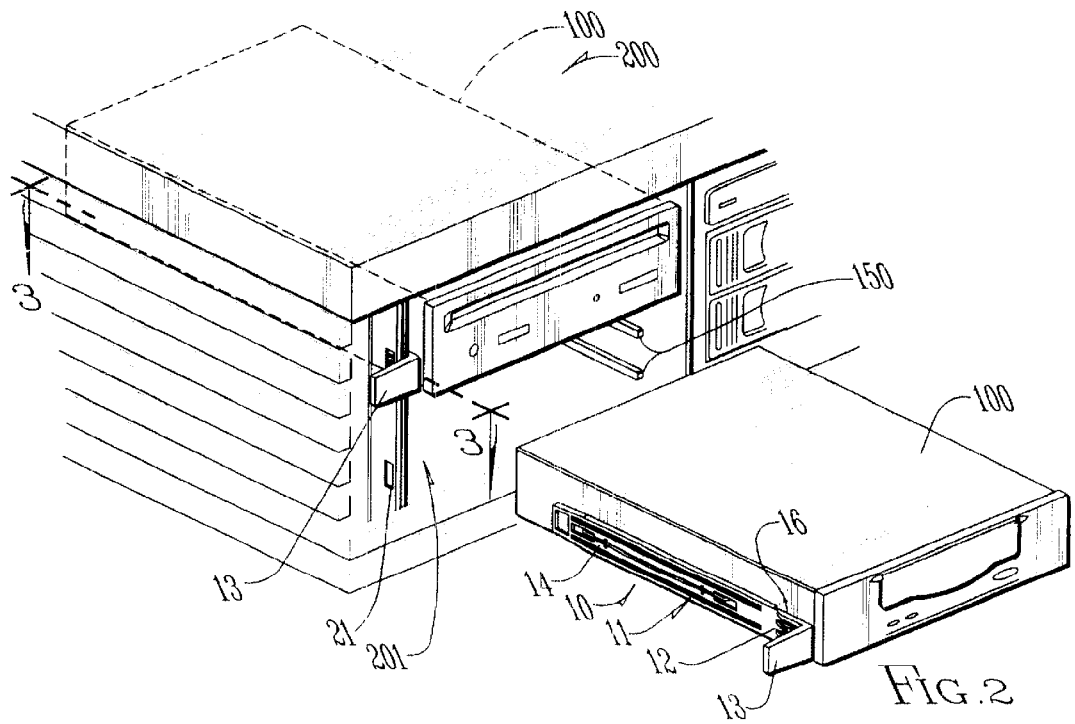
FIG. 2 is a perspective view of the present invention showing the apparatus mounted on drive units positioned within a chassis and removed from a chassis.
Figure 3:
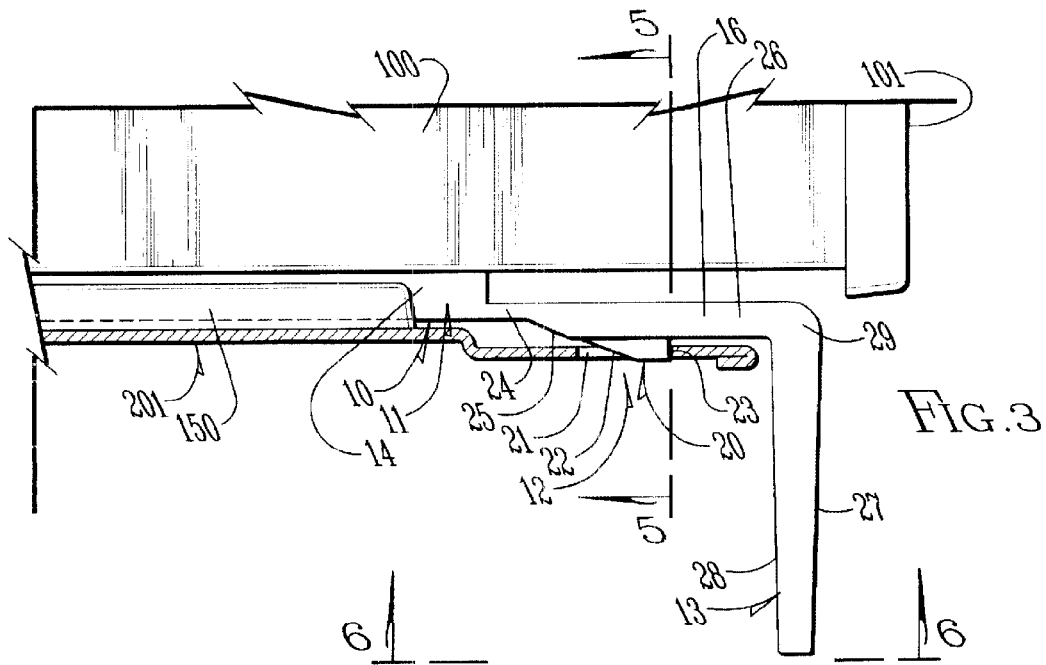
FIG. 3 is a cross-sectional view of the present invention taken along line 3—3 in FIG. 2 showing the resilient arm in an unflexed position and the retention tabs engaged with slots in the chassis.

A drive unit quick release apparatus 10 in accordance with the present invention is shown generally in FIG. 3. The quick release apparatus 10 comprises a guide rail 11 having an engagement structure 12, and a lever 13 for accepting an outward pulling force F to move the engagement structure 12 to a disengaged position and remove a drive unit 100 from a computer chassis 200. Preferably, the apparatus 10 is made of a continuous piece of molded material, such as plastic, but could also be made from metal or any other known material that has some degree of flexibility. The apparatus 10 is used in conjunction with a standard guide rail and bracket known in the art to cooperatively guide a drive unit 100 into and out of a bay 201 of the computer chassis 200. The guide rail 11 is a cantilevered rectangular member extending generally parallel to the drive unit 100. Preferably, guide rail 11 is generally planar and mates with support brackets 150 in the bay 201 of the computer chassis 200. The guide rail comprises a first member 14 and a resilient arm 16 that extends longitudinally away from the first member 14 toward the front face 101 of drive unit 100. The resilient arm 16 is spaced from and extends substantially parallel to drive unit 100 and includes a substantially rigid region 24, a transition region 25, and a flexion region 26 that terminates in a lever 13. The juncture between the first member 14 and resilient arm 16 defines a fulcrum 23 about which the resilient arm 16 rotates.

The engaging structure 12 comprises at least one detent 20 mounted to the flexion region 26 of the rail 11. The flexion region 26 is configured with longitudinally extending channels to reduce the relative cross-sectional area and thus promote flexion between the longitudinal channels 15.

The detent 20 is configured to mate with a slot 21 formed in the bay 201 of the computer chassis 200 to provide retention against sliding of the drive unit 100 out of the bay 201. Preferably, the detent 20 comprises two retention tabs 22 extending laterally outwardly from the resilient arm 16. The retention tabs 22 present a flat forward surface 23 perpendicular to and outwardly of the axis of travel of the drive unit to aid in retaining the tabs in the slot 21. The detent 20 is mounted longitudinally along the resilient arm 16 between the rigid region 24 and lever 13 at a location sufficiently remote from fulcrum 23 to provide sufficient clearance for disengagement of detent 20 from slot 21 when a force is applied to flex the resilient arm 11. Preferably, the detent 20 is located midway between the first member 14 and lever 13 of the resilient arm 11.

The lever 13 has a front surface 27 and a back surface 28, and extends laterally outwardly from the outermost portion of resilient arm 16 of the guide rail 11. The lever 13 tapers from a fixed end 29 attached to the resilient arm 16 to a free end 29. The lever 13 is oriented perpendicular to both the resilient arm 11 and the axis of travel of the drive unit 100 into and out of the bay 201 of the computer chassis 200 when the arm 11 is unflexed. The lever 13 is of a sufficient reach as to provide adequate leverage for the force of a user's finger to remove the drive unit 100 from the computer chassis bay 201. Specifically, the reach of lever is sufficient to accept the user's finger at an outer portion thereof such that the finger is placed outwardly away from the longitudinal axis of the resilient arm 16 of the guide rail 11. When a pulling force is applied to the back surface 28 of the lever 13 in the direction of the axis of travel for the drive unit 100, a moment is created about fulcrum 23 causing flexing of the resilient arm 16 about the fulcrum. This, in turn, causes arm 16 to move inwardly toward drive unit 100 to release the retention tabs 20 from the slot 21. The lever 13 undergoes some degree of tilt with respect to its original orientation when the arm 11 is unflexed. The lever 13, however, remains in a substantially perpendicular orientation to the rail 11 and the axis of travel of the drive unit 100.

To operate the quick release apparatus 10 in conjunction with the guide rails and brackets of drive unit 100, the unit 100 is first slid into a computer chassis bay 201. The guide rails 150 direct the drive unit 100 into the bay 201 in the proper alignment. When the drive unit 100 is almost fully inserted into the computer chassis 200, the retention tabs 22 create an interference with the sidewall of the computer chassis bay 201. Further insertion of the unit 100 causes the resilient arm 16 to flex inwardly towards the drive unit 100 as the retention tabs 22 press against the bay 201. When the retention tabs 22 become aligned with the slot 21 in the bay 201, the tabs 22 move into the slot 21, allowing the resilient arm 16 to return to the unflexed position and fully engaging the drive unit 100 in the computer chassis 200. The forward surface 23 of the retention tabs 22 secures the drive unit 100 in computer chassis 200.

Figure 4:
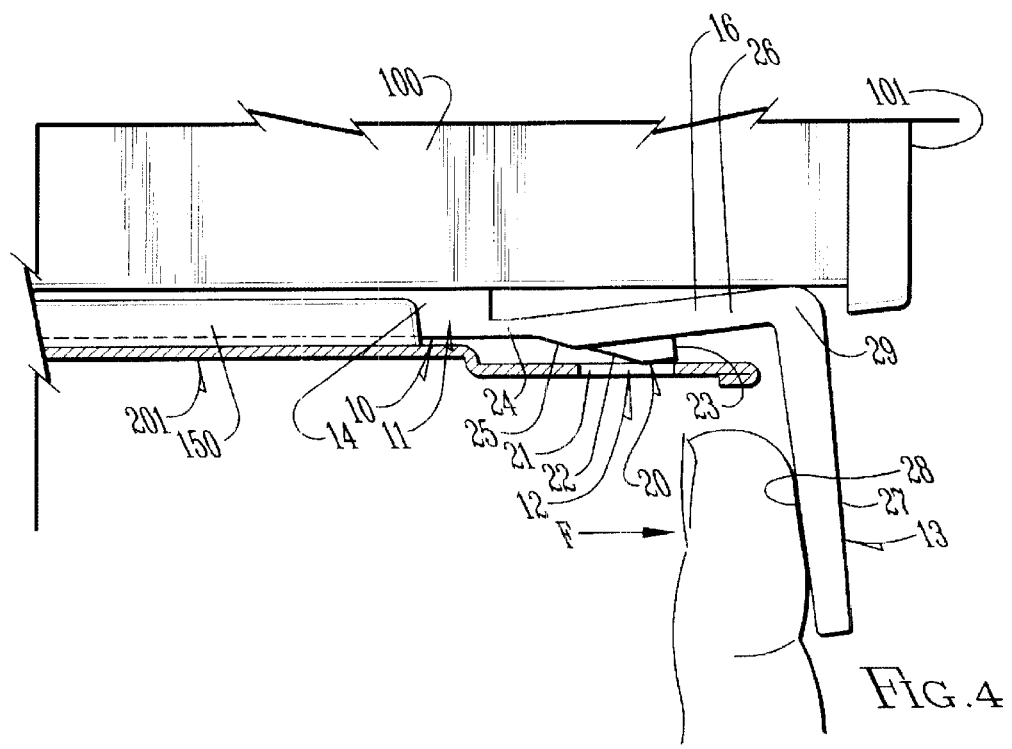
FIG. 4 is a cross-sectional view of the present invention taken along line 3—3 of FIG. 2 showing the resilient arm in a flexed position and the retention tabs disengaged from slots in the chassis.

To remove the drive unit 100, a user applies a pulling force to the lever 13 generally in the direction of travel of the unit 100 out of the computer chassis bay 201, as shown in FIG. 4. Preferably, the user will use a single finger or thumb to apply the force. As stated above, the lever 13 causes flexing of the resilient arm 16 about fulcrum 23, and consequently, causes the detent 20 to move out of the slot 21 and thereby disengage the drive unit 100 from the computer chassis 200. Additionally, as retention tabs 22 flex away from slot 21, the continued application of an outward force to the lever 13 by the user will cause the drive unit 100 to slide out of the computer chassis 200.

In addition to the applications described above, the current invention also provides an apparatus to facilitate the quick release of a variety of electronic components from a chassis, such as the disengaging and removal of an audio receiver/amplifier or other components from a bay in a stereo housing. Additionally, such electronic components can have guiding means varied from the guide rails disclosed herein, so long as the guiding means properly aligns the component in a chassis bay or drawer such that a force applied to the lever on one side of the component would pull the component essentially straight out of the bay. Furthermore, the engagement structure 12 can vary from the retention tabs 22 taught herein to include any means for engaging the current invention 10 with the computer chassis 200, so long as a force applied to the lever 13 can provide sufficient leverage to bend the resilient arm 11 and disengage the engagement structure 12 from the chassis 200.

From the forgoing information, it should now be obvious that the quick release drive unit apparatus 10 provides a more ergonomic, simple, and time-saving solution for securely positioning and removing electronic components from the bay of a chassis. The present invention can be provided on merely one side of a component where space in the chassis is limited. While certain forms of the present invention have been illustrated and described herein, it is not to be limited to the specific forms or arrangement of parts described and shown.

What is claimed is:

1. An apparatus for securing and selectively releasing a component in a chassis, the component being slidably received on a track mounted to the chassis, the apparatus comprising:

a rail having a first member mounted to the component and a resilient arm spaced from the component and defining a longitudinal axis, the juncture between the first member and a resilient arm defining a fulcrum;

an engagement structure positioned on the resilient arm, the engagement structure being releasably engageable with the chassis to secure the component in the chassis; and a lever mounted to the resilient arm of the rail, the lever being substantially perpendicular to the longitudinal axis of the resilient arm and operably configured such that a force applied to the lever causes the resilient arm to disengage with the chassis and move the component outwardly of the chassis.

2. The apparatus of claim 1, wherein the component comprises a pair of guide rails mounted on opposite sides of the component for slidable engagement with a track mounted in a bay of the chassis, the apparatus being one of the pair of guide rails.

3. The apparatus of claim 2, wherein the lever extends outwardly generally perpendicular to the longitudinal axis of the resilient arm sufficiently whereby an outward pulling force on the tab is directed at a location distal from the longitudinal axis of the resilient arm to flex the resilient arm about the juncture.

4. The apparatus of claim 3, wherein the outward pulling force applied to the lever is substantially in the direction of travel of the component out of the bay of the chassis.

5. The apparatus of claim 1, wherein the engagement structure comprises at least one retention tab extending outwardly away from the resilient arm and the component, the at least one retention tab being configured for insertion into at least one slot formed in the chassis.

6. The apparatus of claim 1, wherein the first member comprises a body, the body extending outwardly from the component and presenting an outer surface, the resilient arm extending longitudinally from the first member.

7. The apparatus of claim 1, wherein the resilient arm further comprises a flexion region and a substantially rigid region, the flexion region being of reduced cross-sectional area relative to the substantially rigid region to facilitate proper deflection of the resilient arm rearwardly of the engagement structure for disengagement of the engagement structure with the chassis.

8. The apparatus of claim 1, wherein the component is a computer drive unit.

9. A guide rail system for securing and selectively releasing a component in a chassis, the guide rail system having a pair of guide rails mounted to the component and received in a pair of tracks mounted to the chassis, one guide rail of said pair of guide rails comprising:

a cantilevered arm having a first member mounted to the component, a resilient arm member spaced from the component, a juncture between the first member and the resilient arm member defining a fulcrum for the resilient arm member, and a lever mounted to the resilient arm member; and a retaining tab mounted to the cantilevered arm on said resilient arm member between said fulcrum and said lever, the retaining tab being releasably engageable with one of said pair of tracks to secure the component in the chassis, whereby an outward force on the lever disengages said retaining tab from the one of said pair of tracks and moves the component outwardly of the chassis.

10. The guide rail system of claim 9, wherein the one of said pair of tracks comprises a slot for receiving the retaining tab.

11. The guide rail system of claim 9, wherein the lever is positioned generally perpendicular to the cantilevered arm when the cantilever arm is in an unflexed position.

12. The guide rail system of claim 11, wherein the force applied to the lever causes flexing of the resilient arm member inwardly toward the component.

13. A method for disengaging and removing a component from a chassis comprising the steps of:

providing the component with a pair of guide rails on opposite sides of the component, one guide rail of said pair of guide rails having a cantilevered arm comprising a first member mounted to the component, a resilient arm spaced from the component and terminating in a tab, and a retaining tab being mounted to the resilient arm of the cantilevered arm;

providing the chassis with a pair of tracks configured to receive the guide rails of the component; and applying an outward pulling force to the tab, away from the chassis, the force being sufficient to flex the resilient arm to disengage the engagement structure from the chassis and at least partially slide the electronic component out of the chassis.

14. The method of claim 13, wherein the chassis is provided with a slot and the retention tab is configured for insertion into at least one slot in the chassis.

15. The method of claim 13, wherein the lever is positioned generally perpendicular to an axis of travel of the component into and out of a bay of the chassis.

16. The method of claim 13, wherein the step of applying a force to a lever comprises applying a force substantially in the direction of travel of the electronic component out of a bay of the chassis.

* * * * *